United States Patent [19]
Kant et al.

[11] Patent Number: 4,691,161
[45] Date of Patent: Sep. 1, 1987

[54] CONFIGURABLE LOGIC GATE ARRAY

[75] Inventors: Rajni Kant, Milpitas; Kun-Nau Chen, San Jose, both of Calif.

[73] Assignee: Raytheon Company, Lexington, Mass.

[21] Appl. No.: 744,349

[22] Filed: Jun. 13, 1985

[51] Int. Cl.$^4$ ............................................ G01R 31/26
[52] U.S. Cl. .................................. 324/73 R; 307/465; 371/15
[58] Field of Search ............ 324/73 R, 73 AT, 158 R; 371/15; 307/465

[56] References Cited

U.S. PATENT DOCUMENTS

| | | | |
|---|---|---|---|
| 3,789,205 | 1/1974 | James | 324/73 R X |
| 4,357,703 | 11/1982 | Van Brunt | 324/73 R X |
| 4,410,987 | 10/1983 | Ptasinski et al. | 324/73 R X |
| 4,441,075 | 4/1984 | McMahon | 324/73 R |
| 4,499,579 | 2/1985 | Still et al. | 324/73 R X |
| 4,503,387 | 3/1985 | Rutledge et al. | 324/73 R |
| 4,527,115 | 7/1985 | Mehrotra et al. | 324/73 R |
| 4,534,008 | 8/1985 | Fuchs et al. | 307/465 X |

FOREIGN PATENT DOCUMENTS

| | | | |
|---|---|---|---|
| 72933 | 6/1979 | Japan | 307/465 |
| 70754 | 5/1980 | Japan | 324/73 R |
| 15877 | 1/1984 | Japan | 371/15 |
| 2161608 | 1/1986 | United Kingdom | 324/73 R |

Primary Examiner—Reinhard J. Eisenzopf
Assistant Examiner—Stephen M. Baker
Attorney, Agent, or Firm—Richard M. Sharkansky; Denis G. Maloney

[57] ABSTRACT

An integrated circuit having an array of logic gates adapted to provide predetermined logic functions on a plurality of input logic signals fed to the gate array and produce such predetermined logic functions as output signals at a plurality of array output terminals. A plurality of output buffer circuits are coupled between the outputs of an interconnected gate and the array output terminals. A circuit is provided for electrically decoupling each one of the plurality of logic output buffer circuits from the plurality of array output terminals in response to a common control signal. In a preferred embodiment, the control signal is fed to a single one of the plurality of array output terminals. With such arrangement, in response to the control signal, all logic outputs of the gate array are electrically isolated from other components wired to the gate array thereby allowing diagnostic testing of these other components in spite of the fact that they are wired to the gate array. It also allows parametric testing of three-state condition of the buffers required to be three-state buffers by the customer for normal device operation.

4 Claims, 2 Drawing Figures

CONFIGURABLE LOGIC GATE ARRAY

BACKGROUND OF THE INVENTION

This invention relates generally to integrated circuit configurable gate arrays and more particularly to output signal parametric testing circuitry for such gate arrays.

As is known in the art, it is frequently desirable to manufacture an integrated circuit component having a large number of identical logic gates arranged in an array. Once such integrated circuit is manufactured, the gates in the array thereof are selectively coupled in accordance with the requirements of a customer, such interconnection typically being done during the final metallization process. Such an integrated circuit is sometimes referred to as a configurable gate array. In this way, the integrated circuit manufacturer is able to produce a large number of identical integrated circuit gate arrays which are suitable for a wide variety of uses and in response to the particular needs of its customers is able to, in the final metallization process, personalize the integrated circuit to provide the logic functions required by its customer. Typically, the integrated circuit manufacturer's customer provides the integrated circuit manufacturer with a logic or truth table relating the logical combination of input signals to produce the desired output signals. This relationship between logic input signals and logic output signals provides the basic functional requirement of the integrated circuit gate array. Once the final metallization process selectively interconnects the gates to implement the desired functional relationship between input signals and output signals, a function test is performed to ensure that proper "high" or "low" (i.e., logic 1 and logic 0 signals) are produced at each output pin of the integrated circuit gate array in response to logic signals fed to the input pins of such integrated circuit. This test is performed at very high speeds since there are typically many logic inputs. In addition to this functional test, the integrated circuit manufacturer must ensure that the output signals of the gate array are produced with proper voltage and current levels. These output voltage or current levels are tested by a parametric test and the output levels typically measured are:

1. The high-level output voltage (i.e., the voltage at an output terminal for a specified output current $I_{OH}$) with input conditions applied that according to the product specification will establish a high level at the output;

2. Low level output voltage (i.e., the voltage at an output terminal for a specified output current $I_{OL}$) with input conditions applied that according to the product specification will establish a low level at the output; and 3. Short circuit output current (i.e., the current flowing into an output when that output is short circuited to ground) (or other specified potential) with input conditions applied to establish the output logic level farthest from ground potential (or other specified potential).

To bring each output (one at a time) to the desired low or high state is a very difficult and time consuming task on behalf of test engineer and sometimes requires several weeks of engineering time for a complex Very Large Scale Integration (VLSI) device. One technique used to reduce the test engineer's time is described in co-pending U.S. Pat. application Ser.No. 452,169, filed Dec. 22, 1982, now U.S. Pat. No. 4,527,115, entitled "Configurable Logic Gate Array", inventors Deepak Mehrotra, Rajni Kant and Kishor M. Patel, and assigned to the same assignee as the present invention.

As is also known in the art, when a configured gate array is electrically wired to other electrical components on, for example, a printed circuit board, it is sometimes required to individually test these other electrical components. One way to provide these tests, however, is to un-wire the gate array from the component under test which had been already wired to the component to be tested. After testing the un-wired component, the component, if operative, would have to be re-wired to the other components.

SUMMARY OF THE INVENTION

In accordance with the present invention, an integrated circuit is provided having an array of logic gates adapted to provide predetermined logic functions on a plurality of input logic signals fed to the gate array and produce such predetermined logic functions as output signals at a plurality of array output terminals. A plurality of output buffer circuits is coupled between the outputs of an interconnected gate and the array output terminal. Means is provided for electrically decoupling each one of the plurality of logic output buffer circuits from the plurality of array output terminals in response to a common control signal. In a preferred embodiment, the control signal is fed to a single one of the plurality of array output terminals. With such arrangement, in response to the control signal, all logic outputs of the gate array are electrically isolated from other components wired to the gate array thereby allowing diagnostic testing of these other components in spite of the fact that they are wired to the gate array.

BRIEF DESCRIPTION OF THE DRAWINGS

The foregoing features of this invention, as well as the invention itself, may be more fully understood from the following description read together with the accompanying drawings, in which.

DESCRIPTION OF THE PREFERRED EMBODIMENT

Figure 1:
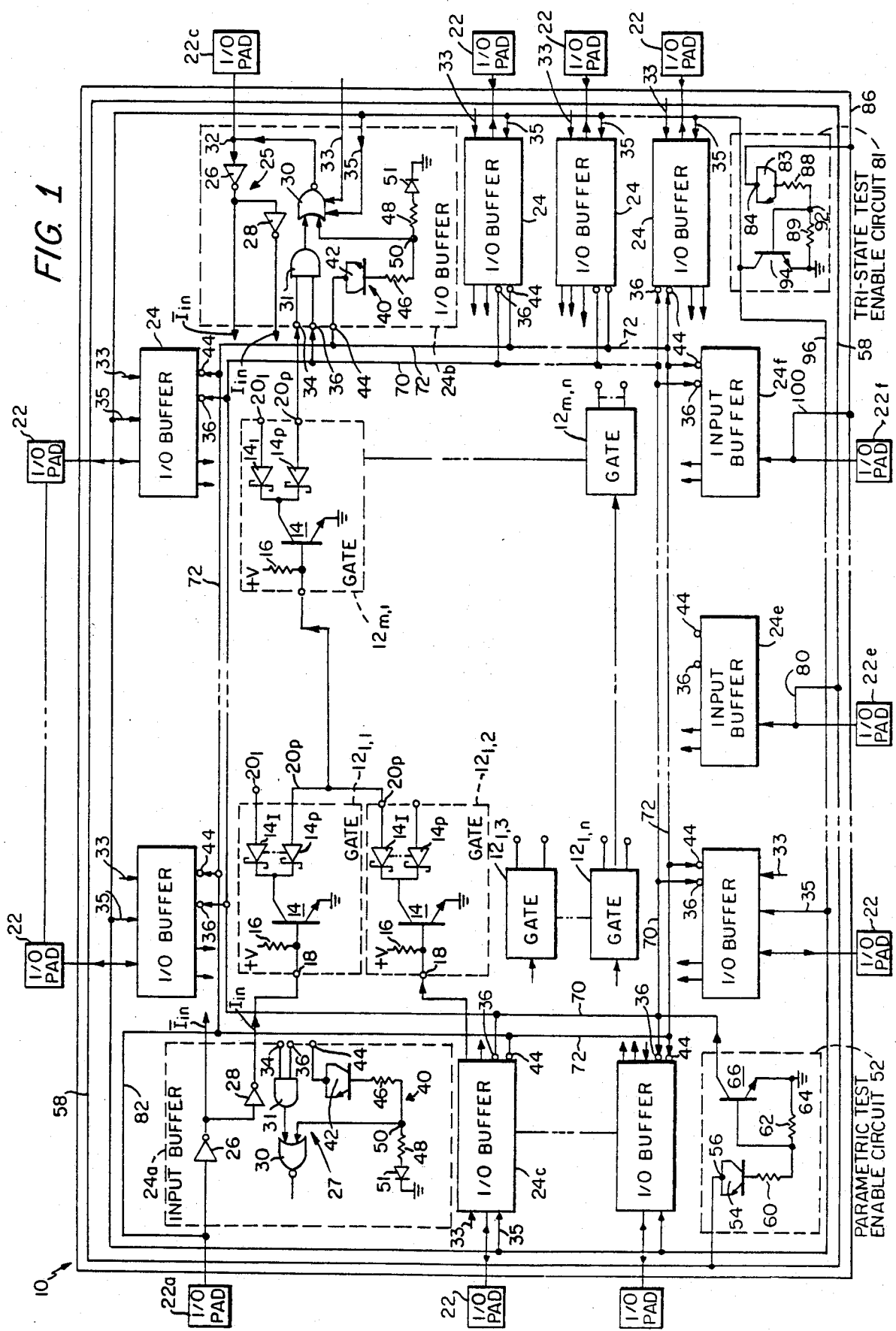
FIG. 1 is a schematic diagram of an integrated circuit logic gate array having a parametric testing circuit according to the invention.

Referring now to FIG. 1, a configurable gate array integrated circuit 10 is shown to include an array of m columns and n rows of logic gates $12_{1,1}$ to $12_{m,n}$, as shown. Each one of the logic gates is identical in construction and gates $12_{1,1}$, $12_{1,2}$ and $12_{m,1}$ are shown in detail to include a grounded emitter transistor 14 having collector electrodes coupled to the cathodes of a plurality of Schottky diodes $14_1$ to $14_p$ and a base electrode coupled to a suitable positive voltage supply ($+V$) through a resistor 16 and to an input terminal 18. The anodes of the Schottky diodes $14_1$ to $14_p$ are coupled to output terminals $20_1$ to $20_p$, as shown.

The integrated circuit 10 includes a plurality of input/output (I/O) pads 22 disposed about the periphery of the circuit. Each input/output pad 22 is connected to a buffer circuit 24, as shown. Each one of the buffer circuits 24 includes identical components which may be interconnected to provide either an input/output (I/O) buffer, as shown in detail for I/O buffer $24_b$, or as merely an input buffer, as shown for input buffer $24_a$. Thus, buffer circuits 24 (as shown for buffer circuits $24_a$, $24_b$) include, in the input section 25 thereof, a first inverter 26 having the input thereof connected to a corresponding one of the input/output pads 22 and a second inverter circuit 28 having the input thereof connected to the output of the first inverter circuit 26 to thereby provide a pair of complementary and true signals $\bar{I}_{in}$, $I_{in}$ at the outputs of the first and second inverter circuits 26, 28 in response to an input signal $I_{in}$ fed to the input/output pad 22 connected thereto. The buffer circuits 24, in addition to the input section 25 described above, include an output section 27, such output section 27 including a NOR gate 30 having the output thereof connected to the first inverter circuit 26 and input/output pad 22 connected to such input/output buffer circuit 24 at terminal 32 when interconnected as an input/output buffer, as shown for exemplary input/output buffer circuit $24_b$; however, such NOR gate 30 output is not electrically connected when such buffer is used as an input buffer, as shown for exemplary input buffer $24_a$. Also provided in such output section 27 is an AND gate 31 having the output thereof connected to one input of the NOR gate 30. The AND gate 31 is coupled to a pair of inputs 34, 36 which also provide a pair of inputs for the buffer circuits 24, as shown for exemplary buffer circuits $24_a$, $24_b$. A second input of the NOR gate 30 is connected to a "low" voltage output parameter simulating circuit 40, such circuit 40 including a Zener diode connected transistor 42. Transistor 42 has its emitter and collector electrodes connected together and to a third input terminal 44 of the buffer circuits 24, as shown for exemplary buffer circuits $24_a$, $24_b$. The transistor 42 has the base electrode thereof connected to ground through a pair of resistors 46, 48 serially connected together at a common terminal 50 and a diode 51, as shown. The signal produced at the common terminal 50 is fed to the second input of the NOR gate 30.

The integrated circuit 10 also includes a parametric test enable circuit 52. Such parametric test enable circuit 52 includes a Zener diode connected transistor 54. The transistor 54 has the emitter and collector electrodes thereof connected together at a terminal 56, such terminal 56 being connected to a bus 58 which is disposed adjacent the outer periphery of the integrated circuit 10, as shown. The base electrode of transistor 54 is connected to ground through a pair of resistors 60, 62 which are serially connected together at a terminal 64. The parameter test enable circuit 52 also includes a grounded emitter transistor 66, such transistor 66 having the base electrode thereof connected to terminal 64 and collector electrode thereof connected to a bus 70 which is disposed about the outer periphery of the array of logic gates $12_{1,1}$ to 12m,n, as shown. A third bus 72 is disposed about the bus 70, as shown, such bus 72 being connected to the input terminal 44 of each one of the input/output buffer circuits 24, as indicated. It is noted that bus 70 is connected to input terminal 36 of each one of the input/output buffer circuits 24, as shown. It is also noted that buses 70, 72 are not electrically connected to input terminals 36, 44 of the buffer circuits 24 which are electrically interconnected as input buffer circuits, as shown for input buffer circuit $24_a$. It is further noted that the interconnection, i.e., configuration of the buffer circuits 24 as either an I/O buffer circuit or an input buffer circuit is done during the metallization process at the same time as the array elements are customized.

The integrated circuit 10 also includes a tri-state circuit 81. Such circuit 81 includes a Zener diode connected transistor 83. The transistor 83 has its emitter and collector electrodes connected together at terminal 84, such terminal being connected to a bus 86 which is disposed adjacent the outer periphery of the integrated circuit 10, as shown. The base electrode of transistor 83 is connected to ground through a pair of resistors 88, 89 which are serially connected together at a terminal 92. The tri-state circuit 81 also includes a grounded emitter transistor 94, such transistor 94 having the base electrode thereof connected to terminal 92 and collector electrode thereof connected to tri state control lines 35 of input/output buffers 24 via a bus 96. It is noted that control lines 35 are connected to only those of the input/output buffers 24 which are to include three-state output buffers, as shown, for example, buffer $24_b$.

When integrated circuit 10 is fabricated as described above, it is noted that each of the logic gates $12_{1,1}$ to $12_{m,n}$ has no electrical interconnections to any other elements of the integrated circuit 10. That is, after fabrication, there are no electrical interconnections to inputs 18 or outputs $20_1$ to $20_p$. Further, the output signals produced by the first and second inverters 26, 28 are not connected to any other components of the integrated circuit 10. Finally, it should be noted that at this point in the fabrication process, the input terminals 34 are not connected to any other circuit elements of the integrated circuit 10. Having mass produced a number of the integrated circuits 10 described above, the logic functions required of the integrated circuit by the integrated circuit manufacturer's customer is provided to the integrated circuit manufacturer to configure, or customize the integrated circuit gate array as required to meet the customer's requirements. Thus, for example, and merely by way of illustration, let it be assumed that buffer $24_a$ is to be configured as an input buffer and that the output of the second inverter circuit 28 of the configured input buffer $24_a$ is to be connected to the input terminal 18 of logic gate $12_{1,1}$ and the buffer circuit $24_c$ is to be configured as an I/O buffer with the first inverter circuit (not shown) in input/output buffer circuit $24_c$ connected to the input terminal 18 of logic gate $12_{1,2}$. Let it further be required that the outputs of Schottky diodes $20_p$ of gate $12_{1,1}$ are to be connected to the Schottky diode $14_1$ of gate $12_{1,2}$. Further, let it be assumed that it is required that the combined outputs of gate $12_{1,1}$ and gate $12_{1,2}$ be connected to the input 18 of gate $12_{m,1}$ and that the output of such gate $12_{m,1}$ is to be produced at input/output pin designated by numeral $22_c$ and which is connected to the buffer circuit designated $24_b$. Thus, output pin $20_p$ of gate $12_{m,l}$ is connected to input terminal 34 of input/output buffer circuit $24_b$ which is to be configured as an I/o buffer circuit, as described above. Let it further be assumed that the buffer circuit designated $24_e$ is configured as an input buffer circuit. It should be understood that what has just been described is only one of the may electrical interconnections which may be made by the integrated circuit manufacturer during the final metallization process to selectively interconnect the gates $12_{1,1}$ to $12_{m,n}$ together and also the input terminals and output terminals of selected ones thereof to selected buffer circuits 24 to thereby provide the logic functional relationship which relates logic input signals fed to selected ones of the input/output pads 22 to other selected ones of such input/output pads 22. During the final metallization process wherein the gates of the array are selectively interconnected in accordance with the customer's requirements as regards his logic function requirements, the integrated circuit manufacturer notes various ones of the buffer circuits which are not required for use in implementing the logic requirements of the customer and which have been configured as input buffer circuits such as buffer circuits $24_a$, $24_c$. Once identified, the integrated circuit manufacturer interconnects bus 58 to the input/output pad connected to one of the buffer circuits that is configured as input buffer circuit 24, here to the input/output pad connected to the input/output buffer circuit designated by numeral $24_c$, as shown by electrical interconnect 80 which is connected between the input/output pad designated by numeral $22_c$ and bus 58. Also, the manufacturer interconnects bus 86 to another input/output pad connected to another one of the buffer circuits that is configured as an input buffer circuit, here input buffer circuit $24_f$; here, pad designated $22_f$ is connected to bus 86 via electrical interconnect 100, as shown. Also, the manufacturer interconnects bus 72 to another one of the buffer circuits that is configured as input buffer circuit, here the input/output buffer circuit designated $24_a$, such interconnect being shown by conductor 82. That is, buses 58, 72 may be connected to any one of the buffer circuits 24 which are configured as an input buffer circuit, such as buffer circuit $24_a$, or to an unused one of the buffer circuits 24.

Once configured or customized in accordance with the customer's requirements, the integrated circuit manufacturer applies all possible logic combinations to the input/output pads 22 which are designated by the customer to be fed by input logic signals to determine if proper output logic signals are produced at the specific input/output pins 22 specified by the customer. This functional testing thus is performed to ensure that when proper "high" and "low" input signals are fed to the configured gate array integrated circuit 10, proper "high" and "low" output signals are produced by the configured gate array integrated circuit 10.

Having performed this functional testing of the configured gate array integrated circuit 10, the integrated circuit manufacturer places the integrated circuit 10 in the parametric test mode. This is performed by applying a relatively "high" voltage (i.e., greater than the normal logic "high" voltage) to the one of the input/output pads 22 which has been electrically interconnected to bus 58, here the input/output pad 22 designated by numeral $22_c$ which has been electrically interconnected to bus 58 through interconnect 80. In particular, a relatively high voltage, here greater than 10 volts, is fed to the input/output pad designated by numeral $22_c$ thereby exceeding the breakdown voltage of Zener diode connected transistor 54 producing a relatively high voltage at terminal 64 thereby driving transistor 66 into saturation and thereby producing a logical low (i.e., approximately 0.3 volt) signal on bus 70. The signal on bus 70 is fed to the input terminal 36 of each one of the input/output buffer circuits 24. In order to perform a parametric test on the output signals produced by the input/output buffer circuits 24 which measures the output voltages associated with logical "low" signals, a relatively "high" voltage, here greater than 10 volts, (i.e., a voltage greater than the normal logical "high" voltage) is fed to bus 72 through the input/output pad designated $22_a$ and coupled to such bus 72 by interconnect 82, as described above. In response to the relatively "high" greater than 10 volt signal on bus 72, the breakdown voltage of Zener diode connected transistor 42 of the input/output configured buffer circuit (such as I/O buffer circuit $24_b$) is exceeded and a "high" or logical 1 signal is produced at terminal 50, such signal forcing the output of NOR gate 30 to a logical 0 or "low" voltage (approximately 0.3 volts) condition. Thus, with a greater than 10 volt signal applied to input/output pad $22_c$ and applied to input/output pad $22_a$, "low" voltage output parameter simulating circuit 40 thereby produces simulated logical 0 signals at each of the input/output pads 22 which are connected to the input/output configured buffer circuit, such as I/O buffer circuit $24_b$, such signals being measured to determine if they meet the parametric output signal requirements of the manufacturer under a "low" level logic output signal condition. In order to test the output parameters of output signals produced to represent "high" logic signals, a logical 0 signal is fed to the input/output pad $22_a$ thereby producing a logical "low" signal on bus 72. This relatively "low" signal does not exceed the Zener breakdown voltage of the Zener diode connected transistor 42 of the I/O buffer circuit ($24_b$) so that terminal 50 represents a logical 0 condition. Further, the level of the voltage at input/output pad $22_c$ is maintained at a voltage greater than 10 volts so that the signal on bus 70 represents a logical 0 level, thus producing a logical 0 level at the output of AND gate 31 regardless of the logical signal fed to terminal 34. Since both signals fed to NOR gate 30 represent logical 0 signals, the output of NOR gate 30 produces a logical 1 signal. It follows then that when a logical 0 signal is fed to input/output pad $22_a$ and a signal greater than 10 volts is fed to input $22_c$ to place the integrated circuit 10 in the parametric test mode, the input/output pads 22 which are coupled to the input/output configured buffer circuits (as I/O buffer circuit $24_b$) are forced to produce voltages representative of logical 1 signals. It should be noted that the breakdown characteristics of the Zener diode connected transistor 42 is selected to simulate the "off" or logical "high" voltage characteristics of each one of the gates $12_{1,1}$ to $12_{m,n}$; that is, to put it another way, during the parametric test enable mode, circuit 40 produces a voltage which is fed to NOR gate 30, such voltage simulating the same voltage that would be produced at the output pin of any one of the logic gates $12_{1,1}$ to $12_{m,n}$. Thus, for example, referring to the input/output buffer circuit designated by numeral $24_b$, the voltage produced by circuit 40 of such numerically designated input/output buffer circuit $24_b$ simulates the same voltage which would be produced by transistor 14 of gate $12_{m,1}$ when such transistor 14 is in the "off" condition. Further, transistor 66 of the parametric test enable circuit 52 together with the characteristics of the Zener diode connected transistor 54 simulates the logic "low" voltage typically produced by any one of the gates $12_{1,1}$ to $12_{m,n}$ when such one of the gates is in the "on" condition; that is, when the transistor 14 thereof is in a conducting condition to produce a relatively low (i.e., 0.3 volts) signal at the collector electrode thereof.

Finally, during the normal operation mode, standard Transistor-Transistor-Logic (TTL) logic level signals less than the 10 volt enable signal are fed to input/output terminals $22_a$, $22_c$ to thereby disable the parameter test enable circuit 52 with the result that the logic signals produced at the inputs 34 of the input/output buffer circuits 24 pass through such circuits 24, albeit inverted, to the input/output pad 22 connected thereto.

Figure 2:
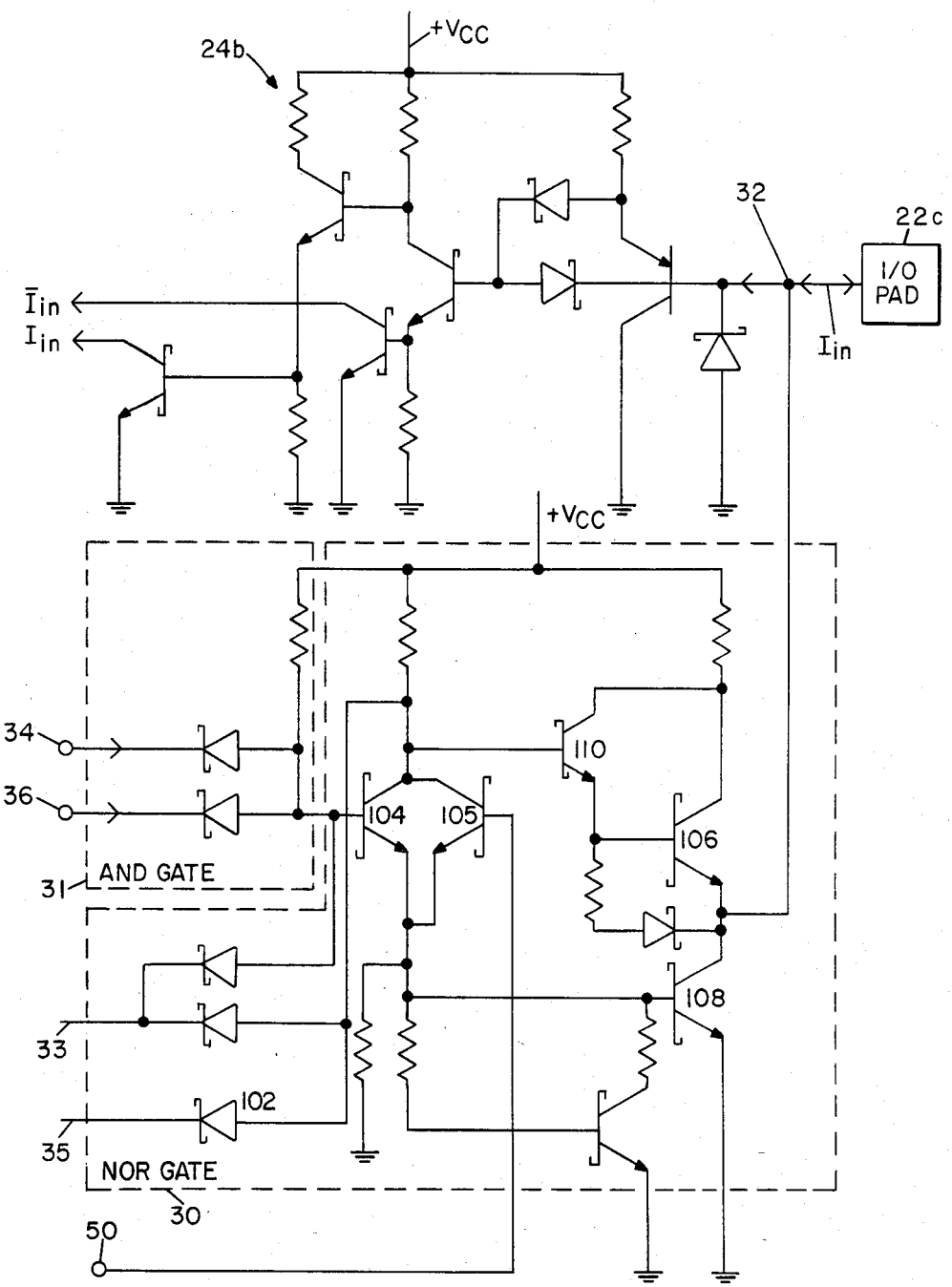
FIG. 2 is a schematic diagram of a portion of an exemplary one of input/output buffer circuits included in the gate array of FIG. 1.

Referring now to FIG. 2, the details of the first and second inverter circuits 26, 28 and the AND and NOR gates 31, 30 of the exemplary input/output buffer circuit, here the input/output buffer circuit designated by numeral 24$_b$, are shown. It is noted that when the buffer is configured as an input/output buffer, the buffer also has a conventional three state driver control line 33 and associated circuitry for use by the customer in personalization of the array if desired. It is further noted that a second tri-state control line 35 is connected to bus 96. Thus, when it is desired to electrically decouple the array 10 from other components (not shown) physically wired to the computer output pads 22, a relatively high voltage, i.e., greater than 10 volts, is placed on pad 22$_f$ so that the output of NOR gate 30 is electrically decoupled from the output pads 22$_c$ to thereby electrically isolate the gate array 10 from other components (not shown) electrically wired to the gate array 10 as part of an overall system. Thus, the relatively "high" voltage (greater than 10 volts) at I/O pad 22$_f$ causes the Zener diode connected transistor 83 to "break-down" drawing transistor 94 into saturation producing a low voltage, here about 0.2 volts, on bus 96. This low 0.2 volts thus forward biases diode 102 placing low voltages at the collectors of transistors 104, 105 and at the base electrode transistor 110 with the result that transistors 106, 108 are biased to non-conducting, high-impedance (i.e., substantially open-circuit) conditions. It is noted that in the absence of this relatively "high" voltage on pad 22$_f$, the Zener connected transistor 83 does not conduct and hence transistor 94 is in a non-conducting condition allowing normal operation of the NOR gate 30. Thus, a single common control signal, i.e., the voltage on pad 22$_f$, is used to electrically decouple each one of the output buffers 24 from the output pads coupled thereto.

Having described a preferred embodiment of this invention, it is evident that other embodiments incorporating these concepts may be used. For example, while Integrated Schottky Logic (ISL) gates have been shown, other types of logic gates such as Transistor-Transistor Logic (TTL) gates or any other type of gates may be used. It is felt, therefore, that this invention should not be restricted to the disclosed embodiment, but rather should be limited only by the spirit and scope of the appended claims.

What is claimed is:

1. An integrated circuit comprising:
 (a) an array of logic gates, selected logic gates of the array of logic gates being interconnected to provide predetermined logic functions on a plurality of input logic signals to the gate array and produce said predetermined logic functions as output signals at a selected one or ones of a plurality of array output terminals;
 (b) a plurality of buffer circuits, each one of said plurality of buffer circuits being coupled to a corresponding one of a plurality of signal pads, a selected one or ones of said plurality of buffer circuits being further coupled between the selected one or ones of the plurality of array output terminals and the corresponding one or ones of the plurality of signal pads; and
 (c) means for electrically decoupling the selected one or ones of the plurality of buffer circuits from the corresponding one or ones of the plurality of signal pads in response to a common control signal applied to a signal pad corresponding to an unselected one of the plurality of buffer circuits, said electrical decoupling means comprising means for electrically coupling said signal pad corresponding to an unselected one of the plurality of buffer circuits to said electrical decoupling means.

2. The integrated circuit recited in claim 1 further comprising parametric testing circuit means responsive to a control signal for: electrically coupling, during a normal operating mode, the output signals of the interconnected logic gates produced at the selected one or ones of the array output terminals to the one or ones of the plurality of signal pads coupled thereto or, during a parametric testing mode, electrically decoupling the selected one or ones of the array output terminals from the one or ones of the plurality of signals pads coupled thereto, while electrically coupled to said one or ones of the plurality of signal pads a parametric signal source, such source producing "high" and "low" output voltages during the parametric testing mode representative of logic output voltages produced by the interconnected logic gates during the normal operating mode in response to the input logic signals.

3. An integrated circuit comprising:
 (a) a plurality of logic gates adapted for electrical interconnection to provide a predetermined logic function relating the logic states of a plurality of input logic signals to logic output signals produced at a plurality of output terminals;
 (b) a plurality of input gates, each one of the plurality of input gates having an input coupled to a corresponding one of a plurality of input pads of the integrated circuit, selected ones of the plurality of input gates having outputs coupled to the plurality of logic gates;
 (c) a plurality of output gates, each one of said pluraity of output gates having an output coupled to a corresponding output pad of the integrated circuit, selected ones of the plurality of output gates having inputs coupled to the plurality of output terminals;
 (d) parametirc testing circuit means having an output coupled to an input of each one of the plurality of output gates and responsive to a control signal for: electrically coupling, during a normal operating modes, the output terminals to inputs of the output gates, the output gates being driven by the logic output signals at the output terminals during the normal operating mode to produce corresponding logic signals at the output pads; or, electrically decoupling the output terminals from the inputs of the output gates while electrically coupling to the inputs of the output gates, during a parametric testing mode, a parametric signal source for producing "high" and "low" logic output voltages representative of logic output voltages produced by the logic gates in response to the logic input signals during the normal operating mode, the output gates being driven by the parametric signal source during the parametric testing mode to produce "high" and "low" voltages at the output pads; and,
 (e) means for electrically producing a substantially open-circuit condition at the output pads in response to a common control signal, said common control signal being applied to an input pad coupled to an unselected one of the plurality of input gates, siad open-circuit condition producing means comprising means for electrically coupling said input pad coupled to an unselected on one of the plurality of input gates to the open-circuit condition producing means.

4. An integrated circuit comprising:
(a) an array of logic gates selectively inerconnected to provide predetermined logic functions on a plurality of input logic signals applied to the array of logic gates and produce said predetermined logic functions as output signals at a plurality of array output terminals;
(b) a plurality of buffer circuits, each one of the plurality of buffer circuits being coupled to a corresponding one of a plurality of signal pads, selected ones of said buffer circuits further being coupled to the plurality of array output terminals; and
(c) means for electrically decoupling the selected ones of the plurality of buffer circuits from the corresponding signal pads in response to a common control signal applied to the signal pad coupled to an unselected one of the plurality of buffer circuits, said decoupling means comprising: signal bus means for coupling the common control signal to the decoupling means, said signal bus means being disposed adjacent to the plurality of buffer circuits; and, means for electrically coupling the signal pad coupled to said unselected one of the plurality of buffer circuits to said signal bus means.

* * * * *